United States Patent
Uchida et al.

(10) Patent No.: US 9,566,779 B2
(45) Date of Patent: Feb. 14, 2017

(54) PASTE SUPPLY APPARATUS, SCREEN PRINTING APPARATUS, PASTE SUPPLY METHOD AND SCREEN PRINTING METHOD

(71) Applicant: PANASONIC INTELLECTUAL PROPERTY MANAGEMENT CO., LTD., Osaka (JP)

(72) Inventors: Hideki Uchida, Yamanashi (JP); Masaaki Tokunaga, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 7 days.

(21) Appl. No.: 14/639,469

(22) Filed: Mar. 5, 2015

(65) Prior Publication Data

US 2015/0266287 A1   Sep. 24, 2015

(30) Foreign Application Priority Data

Mar. 19, 2014 (JP) .................................. 2014-055929

(51) Int. Cl.
*B41F 15/40* (2006.01)
*B41F 31/02* (2006.01)
(Continued)

(52) U.S. Cl.
CPC ............. *B41F 15/40* (2013.01); *B41F 15/085* (2013.01); *B41F 15/405* (2013.01); *B41F 15/42* (2013.01);
(Continued)

(58) Field of Classification Search
CPC ........... B41F 15/40; B41F 15/08; B41F 31/02; B41F 15/42; B41F 15/085; H05K 3/1233; H05K 3/3484
(Continued)

(56) References Cited

U.S. PATENT DOCUMENTS 3,153,815 A * 10/1964 Seidl ................... B29C 45/0005
                                                                 222/342
4,808,435 A *  2/1989 Cropp ...................... B41M 1/12
                                                                 427/272
(Continued)

FOREIGN PATENT DOCUMENTS

JP         06283856 A  * 10/1994  .............. H05K 3/38
JP         08207243 A  *  8/1996  .............. B41F 15/40
(Continued)

*Primary Examiner* — Jill Culler
*Assistant Examiner* — Marissa Ferguson Samreth
(74) *Attorney, Agent, or Firm* — Pearne & Gordon LLP (57) ABSTRACT

A paste supply apparatus includes a pot holding part that holds a paste pot that includes a tubular container which receives paste and is provided with a through hole in a bottom part of the tubular container and an inner lid movable inside the tubular container, in a posture in which the paste can be extruded downwardly from the through hole, an extrusion member configured to hold the inner lid of the paste pot held in the pot holding part, an inner lid holding part with which the inner lid is held in the extrusion member, an extrusion member elevation part that upwardly and downwardly moves the extrusion member, and a stopper with which the container upwardly moved together with the inner lid collides when the extrusion member holding the inner lid is pulled up by the extrusion member elevation part.

12 Claims, 7 Drawing Sheets

(51) Int. Cl.
    *H05K 3/12* (2006.01)
    *H05K 3/34* (2006.01)
    *B41F 15/08* (2006.01)
    *B41F 15/42* (2006.01)

(52) U.S. Cl.
    CPC ............. *B41F 31/02* (2013.01); *H05K 3/1233* (2013.01); *H05K 3/3484* (2013.01)

(58) Field of Classification Search
    USPC .................................. 101/123; 222/602, 607
    See application file for complete search history.

(56) References Cited

U.S. PATENT DOCUMENTS

| | | | | |
|---|---|---|---|---|
| 6,216,589 | B1 * | 4/2001 | Tani ..................... | B41F 15/40 101/123 |
| 2004/0244612 | A1 * | 12/2004 | Willshere ............ | B23K 3/0638 101/123 |
| 2007/0025802 | A1 * | 2/2007 | Dieudonat ............ | A45D 40/02 401/100 |
| 2009/0294483 | A1 * | 12/2009 | Kim ..................... | B41F 15/40 222/386 |
| 2011/0315029 | A1 | 12/2011 | Abe et al. | |

FOREIGN PATENT DOCUMENTS

| | | | | | |
|---|---|---|---|---|---|
| JP | 2003311930 | A * | 11/2003 | ............. | B41F 31/02 |
| JP | 2010-036573 | * | 2/2010 | ............. | B41F 15/40 |
| JP | 2010-172928 | A | 8/2010 | | |
| JP | 2011-140176 | A | 7/2011 | | |
| WO | WO2014122926 | A1 * | 8/2014 | ............. | B41F 31/02 |

* cited by examiner

PASTE SUPPLY APPARATUS, SCREEN PRINTING APPARATUS, PASTE SUPPLY METHOD AND SCREEN PRINTING METHOD

CROSS REFERENCE TO RELATED APPLICATION(S)

The present disclosure relates to the subject matters contained in Japanese Patent Application No. 2014-055929 filed on Mar. 19, 2014, which are incorporated herein by reference in its entirety.

FIELD

One or more embodiments of the present invention relate to a paste supply apparatus for supplying paste in screen printing, a screen printing apparatus, a paste supply method and a screen printing method.

BACKGROUND

A known paste supply apparatus for supplying paste in screen printing is an apparatus for supplying paste to a mask from a syringe in which the paste is stored (see Patent Reference 1 shown below, for instance). Generally, paste is distributed in a state sealed in a container called a paste pot, and when the paste is supplied by the syringe, the paste is shifted from the paste pot and is used. Also in recent years, a paste supply apparatus configured to directly supply paste from a paste pot in order to save shifting is known (see Patent Reference 2 shown below, for instance). Such a paste supply apparatus is configured so that in a posture in which a through hole bored in a bottom part of a container faces downwardly, the paste pot is held and an inner lid of the inside of the container is depressed by a cylinder etc. and the paste is extruded from the through hole.

Patent Reference 1 is JP-A-2011-140176 and Patent Reference 2 is JP-A-2010-172928.

SUMMARY

However, the paste supply apparatus for directly supplying the paste from the paste pot may have a problem that the paste tends to remain with the paste dripping from the through hole.

Hence, one of objects of the invention is to provide a paste supply apparatus, a screen printing apparatus, a paste supply method and a screen printing method capable of solving the problem described above.

According to an aspect of an embodiment of the invention, there is provided a paste supply apparatus including: a pot holding part that holds a paste pot that includes a tubular container which receives paste and is provided with a through hole in a bottom part of the tubular container, and an inner lid movable inside the tubular container, in a posture in which the paste can be extruded downwardly from the through hole; an extrusion member configured to hold the inner lid of the paste pot held in the pot holding part; an inner lid holding part with which the inner lid is held in the extrusion member; an extrusion member elevation part that upwardly and downwardly moves the extrusion member; and a stopper with which the container upwardly moved together with the inner lid collides when the extrusion member holding the inner lid is pulled up by the extrusion member elevation part.

According to another aspect of the embodiment of the invention, there is provided a screen printing apparatus including: a mask; a paste supply apparatus that supplies paste to the mask; and a squeegee that slides on the mask, wherein the paste supply apparatus includes: a pot holding part that holds a paste pot that includes a tubular container which receives paste and is provided with a through hole in a bottom part of the tubular container, and an inner lid movable inside the tubular container, in a posture in which the paste can be extruded downwardly from the through hole; an extrusion member configured to hold the inner lid of the paste pot held in the pot holding part; an inner lid holding part with which the inner lid is held in the extrusion member; an extrusion member elevation part that upwardly and downwardly moves the extrusion member; and a stopper with which the container upwardly moved together with the inner lid collides when the extrusion member holding the inner lid is pulled up by the extrusion member elevation part.

According to still another aspect of the embodiment of the invention, there is provided a paste supply method using a paste pot that includes a tubular container which receives paste and is provided with a through hole in a bottom part of the tubular container, and an inner lid movable inside the tubular container, the method including: depressing the inner lid of the paste pot held in the pot holding part by an extrusion member and downwardly extruding the paste of the inside of the tubular container from the through hole; and pulling up the extrusion member holding the inner lid after the paste is extruded, wherein in pulling up the inner lid, the tubular container upwardly moved together with the inner lid is collided with a stopper to impact on the tubular container.

According to still another aspect of the embodiment of the invention, there is provided a screen printing method using a paste pot that includes a tubular container which receives paste and is provided with a through hole in a bottom part of the tubular container, and an inner lid movable inside the tubular container, the method including: depressing the inner lid of the paste pot held in the pot holding part by an extrusion member and downwardly extruding the paste of the inside of the tubular container from the through hole to an upper surface of a mask in which a pattern hole is formed; pulling up the extrusion member holding the inner lid after the paste is extruded; and printing the paste on a substrate through the pattern hole of the mask by sliding a squeegee on the mask, wherein in pulling up the inner lid, the tubular container upwardly moved together with the inner lid is collided with a stopper to impact on the tubular container.

According to aspects of the embodiment of the invention, remaining paste dripping from the through hole of the paste pot can be separated.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

An embodiment of the invention will hereinafter be described with reference to the drawings. A screen printing apparatus 1 shown in FIG. 1 is an apparatus for performing screen printing of paste such as solder paste on a substrate (not shown), and includes a mask 2 having pattern holes (not shown) formed in correspondence with arrangement of electrodes on the substrate, a print head 3 provided over the mask 2, and a paste supply apparatus 4 provided in the print head 3.

Figure 1:
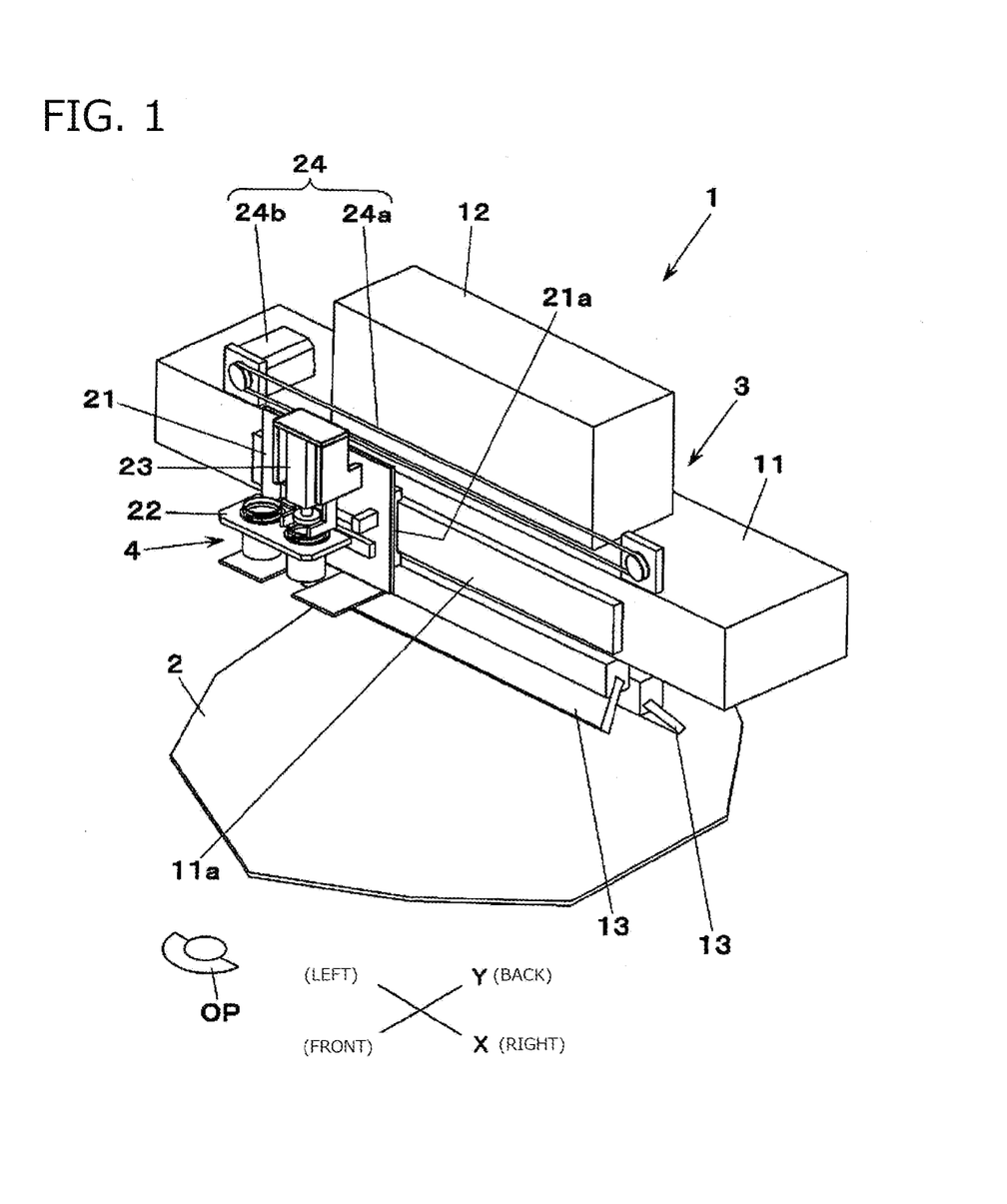
FIG. 1 is a perspective view of a screen printing apparatus in an embodiment of the invention.

In FIG. 1, the print head 3 includes a movement base 11 moved in a front-back direction (called a Y-axis direction) viewed from an operator OP by a head movement mechanism (not shown), a squeegee elevation mechanism 12 provided on an upper surface of the movement base 11, and two squeegees 13 upwardly and downwardly moved mutually independently under the movement base 11 by the squeegee elevation mechanism 12. The two squeegees 13 respectively extend in a left-right direction (called an X-axis direction) viewed from the operator OP, and are oppositely arranged in the Y-axis direction.

Figure 2:
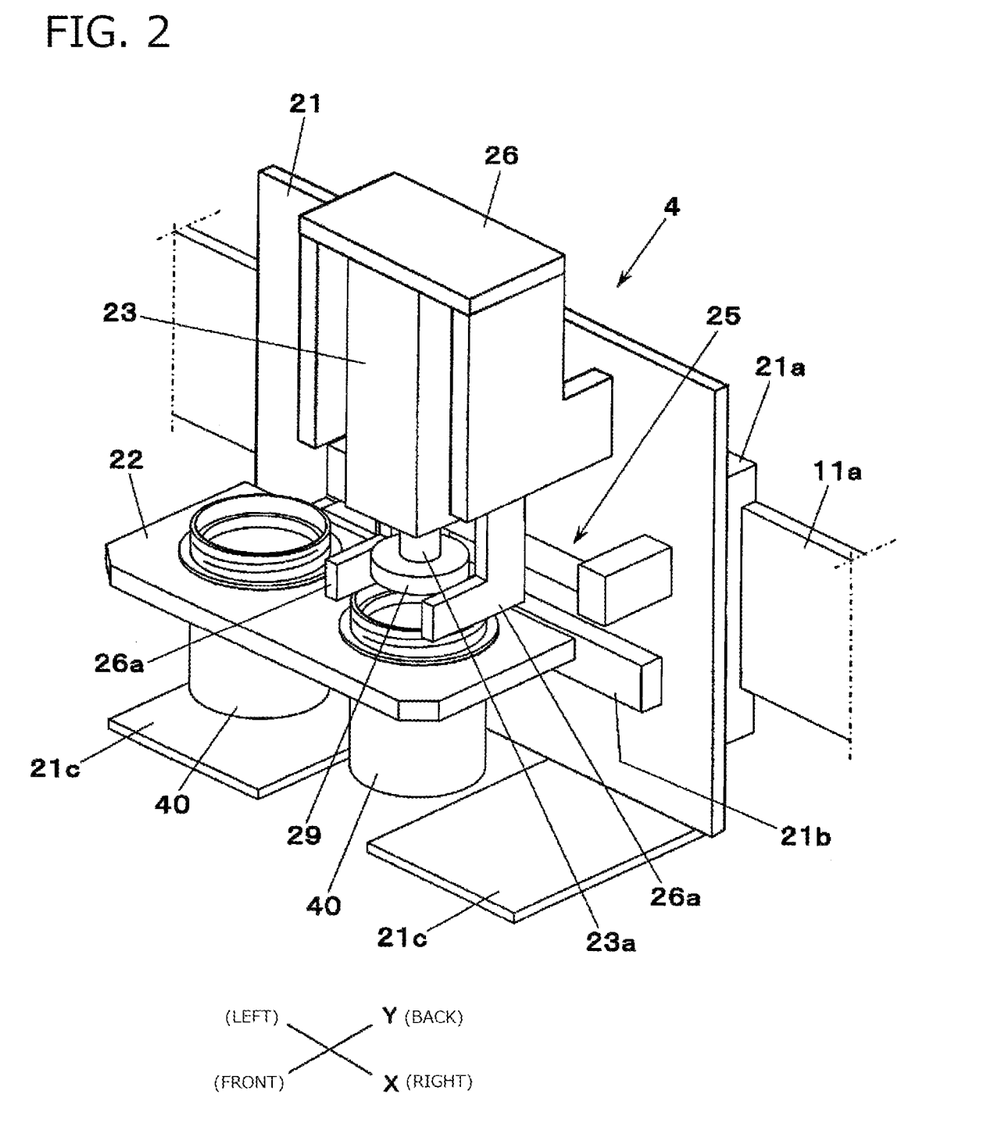
FIG. 2 is a perspective view of a paste supply apparatus included in the screen printing apparatus in the embodiment of the invention.

In FIGS. 1 and 2, the paste supply apparatus 4 includes a base member 21, a pot holding part 22 provided in the front (surface of the side opposed to the operator OP) of the base member 21, and a pressing cylinder 23. The front of the movement base 11 is provided with a first guide 11a extending in the X-axis direction, and a first slider 21a provided on the back side of the base member 21 is slidably attached to this first guide 11a.

In FIG. 1, the movement base 11 is provided with a belt driving mechanism 24 for driving a timing belt 24a looped so as to extend in the X-axis direction by a motor 24b. The timing belt 24a is coupled to the back of the base member 21 and when the motor 24b drives the timing belt 24a, the base member 21, that is, the paste supply apparatus 4 is moved in the X-axis direction.

Figure 3:
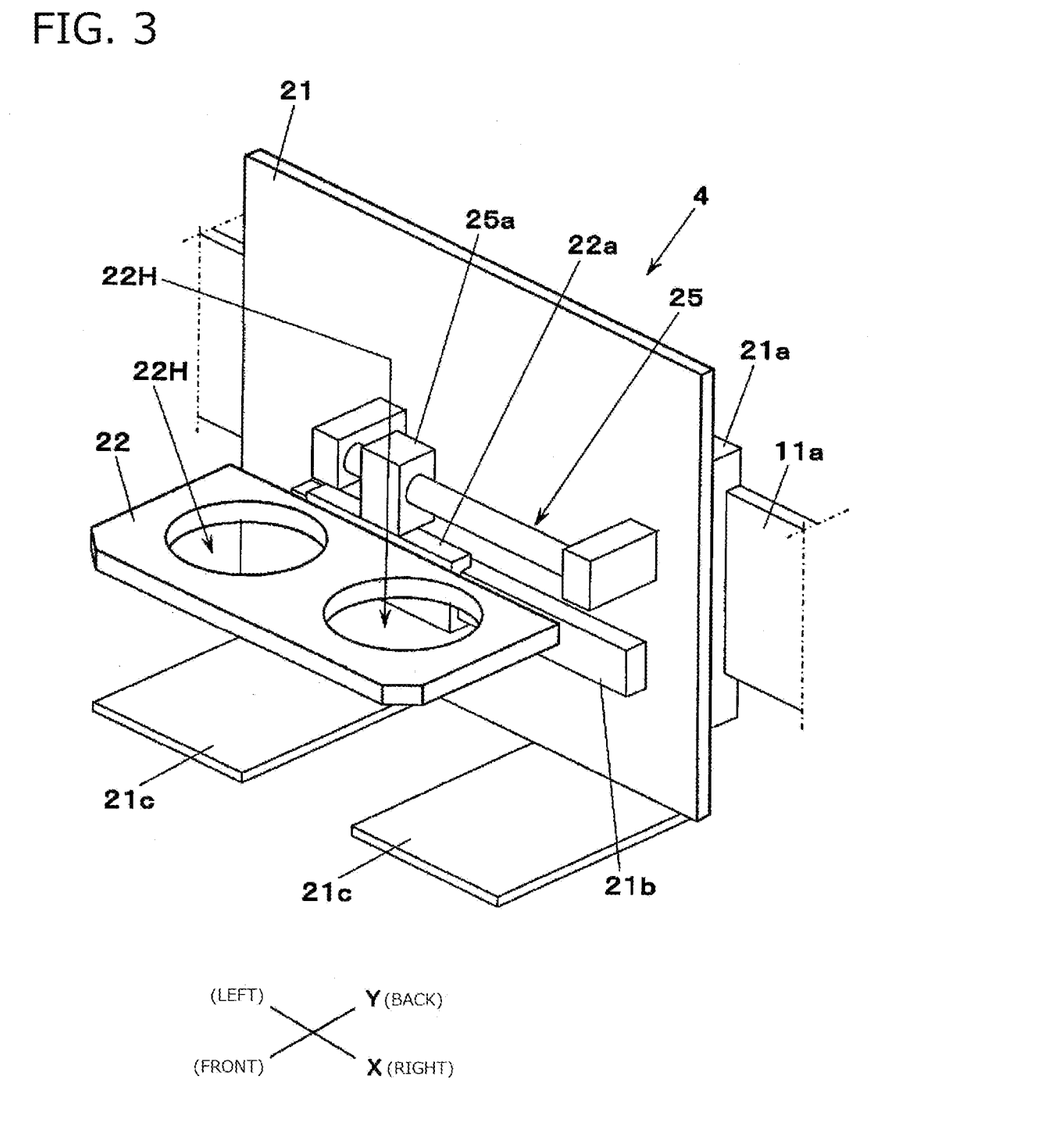
FIG. 3 is a perspective view of the paste supply apparatus in the embodiment of the invention.

In FIG. 3, the pot holding part 22 is made of a horizontal plate-shaped member, and has two pot insertion holes 22H arranged in the X-axis direction. A paste pot 40 described below is inserted into the pot insertion hole 22H of the pot holding part 22.

The front of the base member 21 is provided with a second guide 21b extending in the X-axis direction, and a second slider 22a provided on the back side of the pot holding part 22 is slidably attached to this second guide 21b. The front of the base member 21 and an upward position of the second guide 21b are provided with a rod-less cylinder 25 for moving a moving body 25a in the X-axis direction. The second slider 22a of the pot holding part 22 is coupled to the moving body 25a and when the rod-less cylinder 25 moves the moving body 25a in the X-axis direction, the pot holding part 22 is moved in the front of the base member 21 in the X-axis direction.

In FIG. 2, the pressing cylinder 23 is attached to a bracket 26 provided on the upper portion of the front of the base member 21. In the pressing cylinder 23, a piston rod 23a faces downwardly, and a disk-shaped extrusion member 29 is attached to the lower end of the piston rod 23a.

Figure 4:
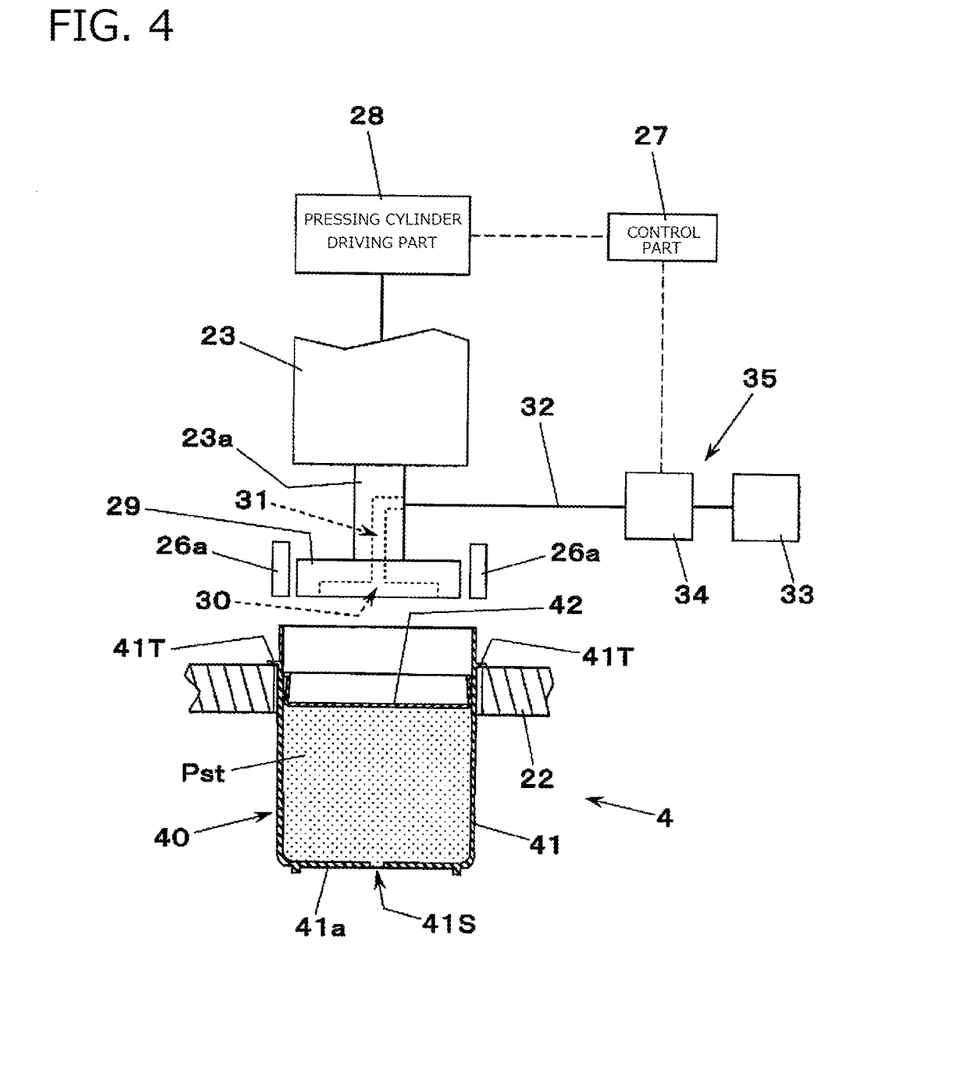
FIG. 4 is a diagram showing a control system of the paste supply apparatus in the embodiment of the invention.

In FIG. 4, the pressing cylinder 23 is driven by a pressing cylinder driving part 28 controlled by a control part 27 included in the screen printing apparatus 1, and performs push actuation and pull actuation of the piston rod 23a to upwardly and downwardly move the extrusion member 29. That is, the pressing cylinder 23 configures extrusion member elevation part for upwardly and downwardly moving the extrusion member 29.

In FIG. 4, the extrusion member 29 has an opening part 30 opened in the lower surface, and a suction path 31 connected to the opening part 30 is provided inside the extrusion member 29 and the piston rod 23a. The suction path 31 is connected to a negative pressure generating part 33 through piping 32 extending to the outside of the piston rod 23a, and a valve 34 is interposed in the piping 32. When the valve 34 is manipulated by the control part 27 with negative pressure generated in the negative pressure generating part 33, a vacuum is supplied to the opening part 30 (that is, to the lower surface of the extrusion member 29) through the piping 32 and the suction path 31, and a suction force is generated inside the opening part 30. Thus, the suction path 31, the piping 32, the negative pressure generating part 33 and the valve 34 configure a suction force generating mechanism 35 for generating the suction force in the lower surface of the extrusion member 29.

Figure 5A:
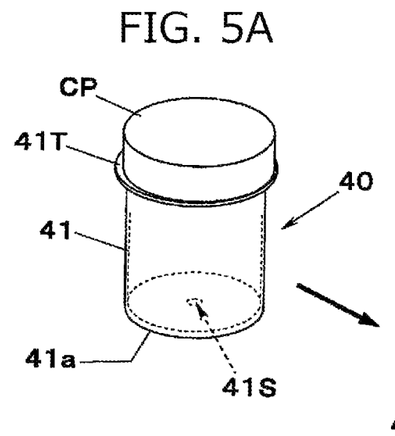
FIGS. 5A to 5C are perspective views of a paste pot used in the paste supply apparatus in the embodiment of the invention.
Figure 5B:
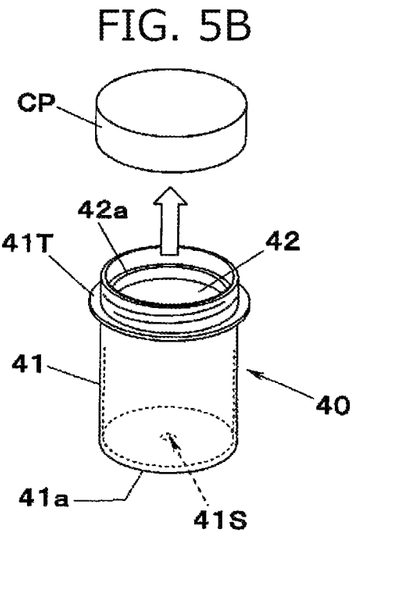
Figure 5C:
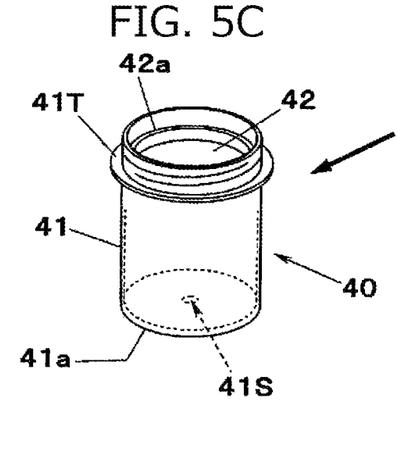

In FIGS. 5A to 5C, the paste pot 40 includes a tubular container 41 for receiving paste Pst and an inner lid 42 provided inside the container 41, and is provided with a through hole 41S in a bottom part 41a of the container 41. The outer edge of the inner lid 42 is upwardly folded back to form a folded-back part 42a, and the folded-back part 42a makes close contact with an inner wall of the container 41. The inner lid 42 can be moved inside the container 41 in a vertical direction.

The paste pot 40 is inserted into the pot insertion hole 22H in a state changed in a posture in which the through hole 41S faces downwardly, that is, in which the paste Pst can be extruded downwardly from the through hole 41S (FIG. 5C) after a cap CP attached to the end of an open side of the container 41 is detached (FIG. 5A→FIG. 5B). By abutting a brim part 41T provided on a side surface of the container 41 on an edge part of the pot insertion hole 22H from the upward side, the paste pot 40 inserted into the pot insertion hole 22H is held in the pot holding part 22 in the posture in which the through hole 41S faces downwardly.

One of the two paste pots 40 held in the two pot insertion holes 22H is positioned in a position (a paste supply position) just under the pressing cylinder 23 by the rod-less cylinder 25, and the other is positioned in a left or right position (a standby position) deviating from the paste supply position. In FIGS. 2 and 3, left and right positions of the lower portion of the base member 21 are provided with plate-shaped paste receivers 21c for receiving the pastes Pst dripping down from the through holes 41S of the paste pots 40 positioned in the standby position.

As shown in FIGS. 2 and 3, the lower end of the bracket 26 is provided with a pair of left and right stoppers 26a extending downwardly. These stoppers 26a are provided in positions capable of abutting on the upper edge of the container 41 of the paste pot 40 when the paste pot 40 held in the pot insertion hole 22H and positioned in the paste supply position is lifted upwardly as it is (also see FIG. 4).

Figures 6A, 6B, 6C:
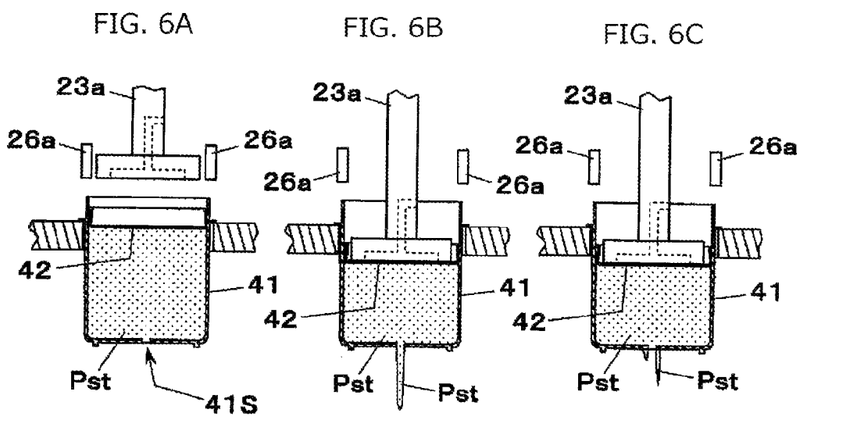
FIGS. 6A to 6F are operation explanatory diagrams of the paste supply apparatus in the embodiment of the invention.

Next, a procedure of execution of screen printing work (screen printing method) of performing screen printing of paste on a substrate using the screen printing apparatus 1 will be described. In the screen printing work, a step of supplying paste Pst to the mask 2 is started from a state in which the paste pot 40 is held in the pot insertion hole 22H of the pot holding part 22 and the paste pot 40 is positioned in a paste supply position of the downward side of the pressing cylinder 23 (FIG. 6A). When an operator OP performs a predetermined work start manipulation on the control part 27 from this state, the control part 27 outputs a paste supply command signal (T1 of FIG. 7). After receiving the output of this paste supply command signal, the pressing cylinder 23 starts push actuation of the piston rod 23a, and depresses the inner lid 42 of the paste pot 40 positioned in the paste supply position by the extrusion member 29, and extrudes the paste Pst of the inside of the container 41 from the through hole 41S (FIG. 6B, and a paste extruding step). During execution of this paste extruding step, the belt driving mechanism 24 controlled by the control part 27 reciprocates the paste supply apparatus 4 in the X-axis direction to supply the paste Pst evenly in a direction in which the squeegees 13 extend.

Figure 7:
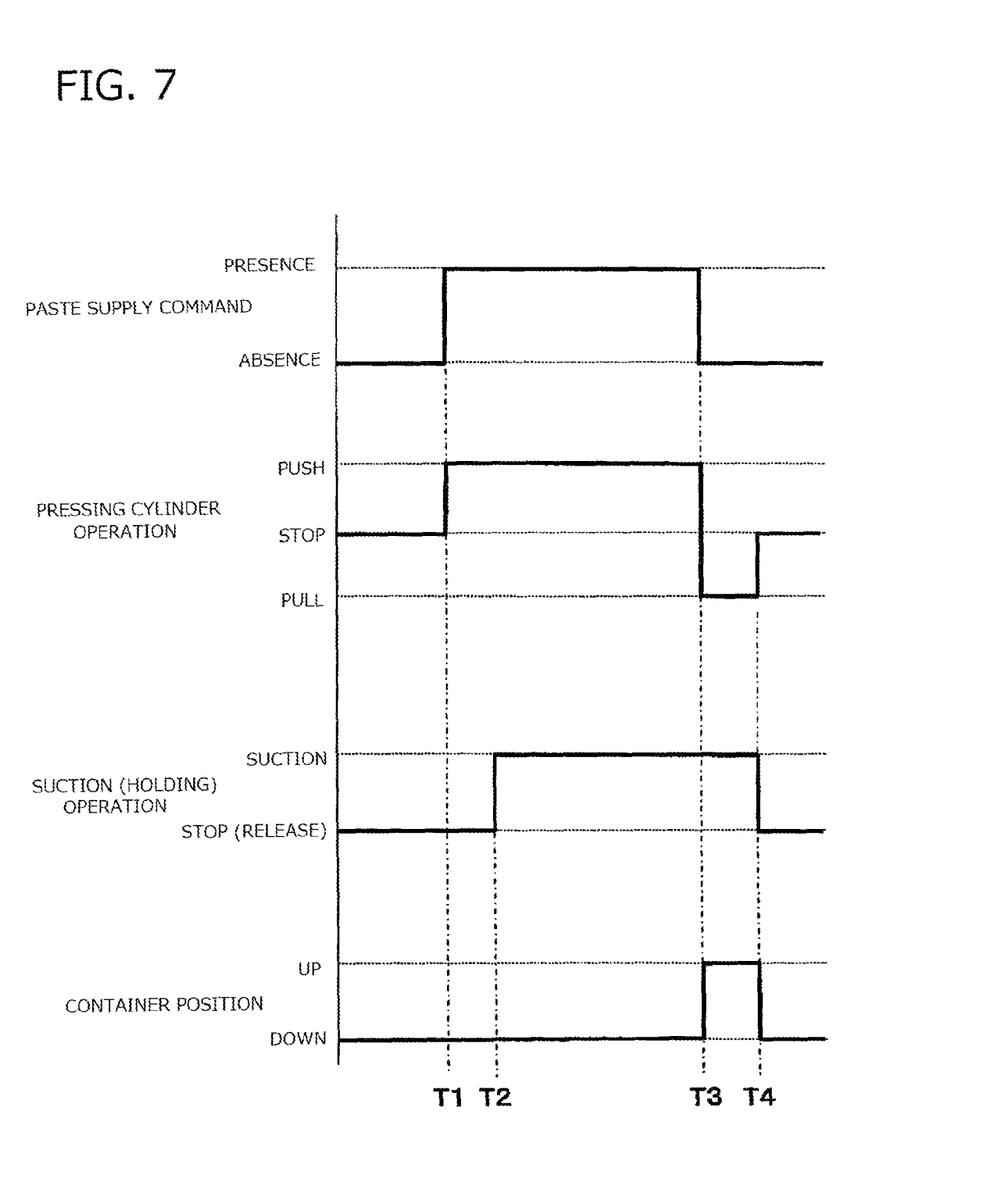
FIG. 7 is a timing diagram of operation of the paste supply apparatus in the embodiment of the invention.

After a stroke of the piston rod 23a reaches a predetermined amount and the extrusion member 29 abuts on the inner lid 42 in the paste extruding step described above, the suction force generating mechanism 35 generates a suction force in a lower surface of the extrusion member 29, and sucks and holds the inner lid 42 in the extrusion member 29 (T2 of FIG. 7). Thus, in the embodiment, the suction force generating mechanism 35 forms inner lid holding part for holding the inner lid 42 of the paste pot 40 in the extrusion member 29. In addition, timing at which the inner lid 42 is sucked in the lower surface of the extrusion member 29 may be not necessarily the timing just after the extrusion member 29 abuts on the inner lid 42 as long as the timing is the timing before an inner lid pull-up step performed later.

The control part 27 stops the output of the paste supply command signal when extrusion of the paste Pst is stopped (T3 of FIG. 7). Accordingly, the pressing cylinder 23 switches operation of the piston rod 23a from the push actuation to pull actuation (FIG. 6C→FIG. 6D), and upwardly moves the extrusion member 29, and pulls up the inner lid 42 sucked and held by the extrusion member 29 (an inner lid pull-up step). After the inner lid 42 is pulled up in this manner, the container 41 is upwardly moved together with the inner lid 42 and is separated from the pot holding part 22, and the container 41 collides with the stoppers 26a from the downward side (FIG. 6D), and thereby the container 41 is impacted on. After the paste Pst extruded from the container 41 continues to be extruded from the through hole 41S after the stop of depression of the inner lid 42 due to a decrease in viscosity, the paste Pst remains in a state dripping from the bottom of the container 41. However, drips of the paste Pst can be cut by impacting on the container 41 as described above. In addition, as the speed at which the paste pot 40 is collided with the stoppers 26a is higher, the paste Pst dripping from the through hole 41S can be cut more easily.

Figures 6D, 6E, 6F:
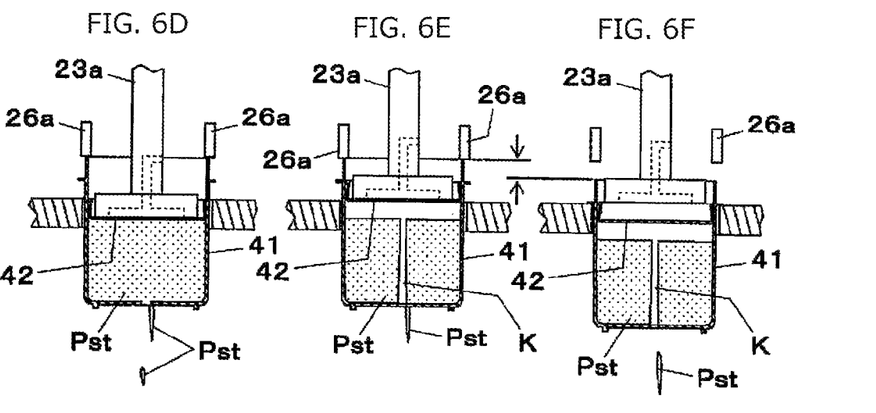

The pressing cylinder 23 continues the pull-up of the extrusion member 29 after the inner lid 42 is pulled up and the container 41 of the paste pot 40 collides with the stoppers 26a as described above. Then, when the extrusion member 29 is further upwardly moved inside the container 41 by a certain amount, the pull-up is stopped (FIG. 6E). After the container 41 collides with the stoppers 26a, the container 41 is not upwardly moved and the inner lid 42 is upwardly moved relatively to the container 41. As a result, the outflow of the paste Pst from the through hole 41S is stopped since negative pressure is generated inside the container 41. When the inner lid 42 is further upwardly moved relatively to the container 41, a pipe-shaped cavity part K upwardly extending from the through hole 41S is formed between the inner lid 42 and the paste Pst by air drawn from the through hole 41S (FIG. 6E).

In such a state, the paste Pst does not exist just over the through hole 41S, with the result that the paste Pst can be prevented from flowing out of the through hole 41S. Particularly, since the paste Pst having thixotropy properties becomes hard in a state released from pressure and the shape of the paste Pst tends to be held, prevention effect is remarkable when the paste Pst used is solder paste. In addition, the amount of pull-up of the inner lid 42 by the pressing cylinder 23 after the container 41 collides with the stoppers 26a can be adjusted by managing pull-up time of the extrusion member 29 by the pressing cylinder 23, and an appropriate amount (normally, about several millimeters) of the pull-up of the inner lid 42 can be obtained by experiment, numerical simulation, etc.

After the inner lid pull-up step described above, the suction force generating mechanism 35 controlled by the control part 27 releases holding (suction) of the inner lid 42 by the extrusion member 29 (T4 of FIG. 7, a holding releasing step). Accordingly, the paste pot 40 falls from a state upwardly separated from the pot holding part 22 (FIG. 6F), and collides with the pot holding part 22 from the upward side and thereby, an impact is again given and drips of the paste Pst remaining even after the container 41 is collided with the stoppers 26a can be cut surely.

After the paste supply apparatus 4 supplies the paste Pst to the mask 2 as described above, a substrate movement mechanism (not shown) brings a substrate into contact with (or brings the substrate near to) a lower surface of the mask 2. After the substrate is brought into contact with (or brought near to) the mask 2, the squeegee elevation mechanism 12 downwardly moves one squeegee 13 and abuts the lower end of the squeegee 13 on the mask 2. Then, the head movement mechanism (not shown) described above moves the print head 3 in the Y-axis direction, and slides the squeegee 13 on the mask 2, and prints the paste Pst on electrodes on the substrate through pattern holes of the mask 2 (a printing step). After the printing step is completed, the substrate movement mechanism described above separates the substrate from the mask 2. Accordingly, the screen printing work on the substrate is completed.

The paste supply apparatus 4 can supply the paste Pst to the mask 2 as described above until the paste Pst of the inside of the container 41 runs out. In the case of detecting that the inner lid 42 reaches the bottom of the container 41 and the paste Pst of the inside of the paste pot 40 runs out from, for example, an output of a stroke sensor (not shown) of the piston rod 23a, the operator OP performs a necessary manipulation on the control part 27. Accordingly, the suction force generating mechanism 35 controlled by the control part 27 releases holding (suction) of the inner lid 42 by the extrusion member 29, and the pressing cylinder 23 performs pull actuation to upwardly move the extrusion member 29. Accordingly, since the extrusion member 29 is pulled out to the upward side of the container 41, the operator OP can detach the container 41 from the pot insertion hole 22H. Also, since the inner lid 42 remains inside the container 41, the container 41 and the inner lid 42 can be discarded collectively.

As described above, the paste supply apparatus 4 and the paste supply method (further, the screen printing apparatus 1 and the screen printing method) in the embodiment are configured so that the inner lid 42 of the paste pot 40 held in the pot holding part 22 in the posture in which the through hole 41S faces downwardly is depressed by the extrusion member 29 and the paste Pst of the inside of the container 41 is extruded from the through hole 41S and thereafter, the extrusion member 29 holding the inner lid 42 is pulled up and the container 41 upwardly moved together with the inner lid 42 is collided with the stoppers 26a to give an impact on the container 41. As a result, the paste Pst remaining with the paste dripping from the through hole 41S of the paste pot 40 can be separated.

A paste supply apparatus, a screen printing apparatus, a paste supply method and a screen printing method capable of separating remaining paste dripping from a through hole of a paste pot are provided.

What is claimed is:

1. A paste supply apparatus comprising:
   a pot holding part that holds a paste pot that includes a tubular container which receives paste and is provided with a through hole in a bottom part of the tubular container, and an inner lid movable inside the tubular container, in a posture in which the paste can be extruded downwardly from the through hole;
   an extrusion member configured to hold the inner lid of the paste pot held in the pot holding part;
   an inner lid holding part with which the inner lid is held in the extrusion member;
   an extrusion member elevation part that upwardly and downwardly moves the extrusion member;
   a stopper with which the container upwardly moved together with the inner lid collides when the extrusion member holding the inner lid is pulled up by the extrusion member elevation part; and
   a base member provided with a bracket,
   wherein the pot holding part is provided in the base member,
   the extrusion member elevation part is provided on the bracket, and
   at a lower end of the bracket, the stopper is provided.

2. The paste supply apparatus according to claim 1, wherein the extrusion member elevation part is configured to pull-up the extrusion member after the tubular container collides with the stopper.

3. The paste supply apparatus according to claim 1, wherein the inner lid holding part is configured to release holding of the inner lid by the extrusion member after the container collides with the stopper.

4. A paste supply method in the paste supply apparatus according to claim 1 using a paste pot that includes a tubular container which receives paste and is provided with a through hole in a bottom part of the tubular container, and an inner lid movable inside the tubular container, the method comprising:
   depressing the inner lid of the paste pot held in a pot holding part by an extrusion member and downwardly extruding the paste of the inside of the tubular container from the through hole; and
   pulling up the extrusion member holding the inner lid after the paste is extruded,
   wherein in pulling up the inner lid, the tubular container upwardly moved together with the inner lid is collided with a stopper to impact on the tubular container.

5. The paste supply method according to claim 4, wherein the pull-up of the inner lid is continued after the tubular container collides with the stopper.

6. The paste supply method according to claim 4, further comprising releasing the holding of the inner lid by the extrusion member after the tubular container collides with the stopper.

7. The paste supply method according to claim 4, wherein a brim part is provided on an outer surface of the paste pot, and the brim part is separated from an upper surface of the pot holding part in the pulling up of the extrusion member.

8. The paste supply apparatus according to claim 1, wherein a brim part is provided on an outer surface of the paste pot, and the brim part is separated from an upper surface of the pot holding part when the extrusion member is pulled up by the extrusion member elevation part.

9. A screen printing apparatus comprising:
   a mask;
   a paste supply apparatus that supplies paste to the mask; and
   a squeegee that slides on the mask,
   wherein the paste supply apparatus comprises:
   a pot holding part that holds a paste pot that includes a tubular container which receives paste and is provided with a through hole in a bottom part of the tubular container, and an inner lid movable inside the tubular container, in a posture in which the paste can be extruded downwardly from the through hole;
   an extrusion member configured to hold the inner lid of the paste pot held in the pot holding part;
   an inner lid holding part with which the inner lid is held in the extrusion member;
   an extrusion member elevation part that upwardly and downwardly moves the extrusion member;
   a stopper with which the container upwardly moved together with the inner lid collides when the extrusion member holding the inner lid is pulled up by the extrusion member elevation part; and
   a base member provided with a bracket,
   wherein the pot holding part is provided in the base member,
   the extrusion member elevation part is provided on the bracket, and
   at a lower end of the bracket, the stopper is provided.

10. The screen printing apparatus according to claim 9, wherein the pull-up of the extrusion member by the extrusion member elevation part is continued after the tubular container collides with the stopper.

11. The screen printing apparatus according to claim 9, wherein the inner lid holding part releases holding of the inner lid by the extrusion member after the container collides with the stopper.

12. The screen printing apparatus according to claim 9, wherein a brim part is provided on an outer surface of the paste pot, and the brim part is separated from an upper surface of the pot holding part when the extrusion member is pulled up by the extrusion member elevation part.

* * * * *